United States Patent
Nakano

(10) Patent No.: US 6,734,950 B2
(45) Date of Patent: May 11, 2004

(54) LOAD-LOCK CHAMBER AND EXPOSURE APPARATUS USING THE SAME

(75) Inventor: Hitoshi Nakano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 09/879,007

(22) Filed: Jun. 13, 2001

(65) Prior Publication Data

US 2002/0024645 A1 Feb. 28, 2002

(30) Foreign Application Priority Data

Jun. 13, 2000 (JP) .................................. 2000-176695

(51) Int. Cl.[7] .................. G03B 27/58; G03B 27/62; B65G 49/07
(52) U.S. Cl. ................... 355/72; 355/75; 414/939
(58) Field of Search ................ 414/939; 355/73, 355/72, 75, 30, 53

(56) References Cited

U.S. PATENT DOCUMENTS

| | | | | |
|---|---|---|---|---|
| 5,121,160 A | | 6/1992 | Sano et al. ................... 355/53 |
| 5,730,573 A | * | 3/1998 | Masujima et al. ........... 414/217 |
| 6,048,154 A | * | 4/2000 | Wytman ...................... 414/217 |
| 6,385,497 B1 | * | 5/2002 | Ogushi et al. .............. 700/110 |

OTHER PUBLICATIONS

Hideo Okabe, "Photochemistry of Small Molecules", *John Wiley and Sons*, New York, 1978, p. 178.

* cited by examiner

*Primary Examiner*—Russell Adams
*Assistant Examiner*—D. Ben Esplin
(74) *Attorney, Agent, or Firm*—Fitzpatrick, Cella, Harper & Scinto

(57) ABSTRACT

Disclosed is a load-lock chamber for loading and unloading a reticle or a wafer into and out of an exposure apparatus, which includes a table having a slotted flat plane for carrying thereon one or more reticles or wafers, a combination of an elevation shaft and an elevation driving unit, for moving the table upwardly and downwardly, a receiving bore for receiving the table with a small clearance maintained between the bore and a side wall of the table, and a load-lock chamber main assembly operable to move the table into the bore and to accommodate or discharge the table with a reticle or a wafer being carried thereon.

17 Claims, 16 Drawing Sheets

CARRYING-IN & -OUT PROCEDURE USING
TWO CONVENTIONAL LOAD LOCKS

| CARRYING-IN & -OUT PORT #1 | CARRYING-IN & -OUT PORT #2 | MAIN ASSEMBLY |
|---|---|---|
| IN → | | |
| CLOSE FRONT DOOR | IN → | |
| PURGE | CLOSE FRONT DOOR | |
| OPEN REAR DOOR | PURGE | |
| OUT → | OPEN REAR DOOR | |
| | | EXPOSURE |
| ← IN | | |
| CLOSE REAR DOOR | OUT → | |
| OPEN FRONT DOOR | | EXPOSURE |
| ← OUT | ← IN | |
| IN → | CLOSE REAR DOOR | |
| CLOSE FRONT DOOR | OPEN FRONT DOOR | |
| PURGE | ← OUT | |
| OPEN REAR DOOR | IN → | |
| OUT → | CLOSE FRONT DOOR | |
| | PURGE | EXPOSURE |
| ← IN | OPEN REAR DOOR | |
| CLOSE REAR DOOR | OUT → | |
| OPEN FRONT DOOR | | EXPOSURE |
| ← OUT | ← IN | |
| IN → | CLOSE REAR DOOR | |
| CLOSE FRONT DOOR | OPEN FRONT DOOR | |
| PURGE | ← OUT | |
| OPEN REAR DOOR | IN → | |
| OUT → | CLOSE FRONT DOOR | |
| | PURGE | EXPOSURE |
| ← IN | OPEN REAR DOOR | |
| CLOSE REAR DOOR | OUT → | |
| OPEN FRONT DOOR | | EXPOSURE |
| ← OUT | ← IN | |
| | CLOSE REAR DOOR | |
| | OPEN FRONT DOOR | |
| | ← OUT | |

← OUT: CARRYING-OUT FROM LOAD LOCK TO OUTSIDE
IN →: CARRYING-IN FROM OUTSIDE INTO LOAD LOCK
OUT →: CARRYING-OUT FROM LOAD LOCK TO MAIN ASSEMBLY CHAMBER
← IN: CARRYING-IN FROM MAIN ASSEMBLY CHAMBER TO LOAD LOCK

FIG. 6

CARRYING-IN & -OUT PROCEDURE USING TWO LOAD LOCKS OF THE INVENTION

| CARRYING-IN PORT #1 | | | | MAIN ASSEMBLY | CARRYING-OUT PORT #1 | | | |
|---|---|---|---|---|---|---|---|---|
| SLOT 1 | SLOT 2 | SLOT 3 | SLOT 4 | | SLOT 1 | SLOT 2 | SLOT 3 | SLOT 4 |
| CARRY-IN | | | | | | | | |
| MOVE-DOWN | | | | | | | | |
| PURGE | CARRY-IN | | | | | | | |
| | MOVE-DOWN | | | | | | | |
| CARRY-OUT | PURGE | CARRY-IN | | | | | | |
| | | MOVE-DOWN | | | | | | |
| | CARRY-OUT | PURGE | CARRY-IN | EXPOSURE | | | | |
| | | | MOVE-DOWN | | | | | |
| | | CARRY-OUT | PURGE | EXPOSURE | CARRY-IN | | | |
| | | | | | MOVE-UP | | | |
| | | | CARRY-OUT | EXPOSURE | CARRY-OUT | CARRY-IN | | |
| | | | | | | MOVE-UP | | |
| | | | | EXPOSURE | | CARRY-OUT | CARRY-IN | |
| | | | | | | | MOVE-UP | |
| | | | | | | | CARRY-OUT | CARRY-IN |
| | | | | | | | | MOVE-UP |
| | | | | | | | | CARRY-OUT |
| MOVE-UP IN WHOLE PROCESS | | | | MOVE-DOWN IN WHOLE PROCESS | MOVE-DOWN IN WHOLE PROCESS | | | |

FIG. 7

| FIG. 8A |
| FIG. 8B |

CARRYING-IN & -OUT PROCEDURE USING
THREE LOAD LOCKS OF THE INVENTION

| CARRYING-IN & -OUT PORT #1 | CARRYING-IN & -OUT PORT #2 | CARRYING-IN & -OUT PORT #3 | MAIN ASSEMBLY |
|---|---|---|---|
| IN → | | | |
| MOVE-DOWN | IN → | | |
| PURGE | MOVE-DOWN | IN → | |
| MOVE-DOWN | PURGE | MOVE-DOWN | |
| OUT → | MOVE-DOWN | PURGE | |
| | | MOVE-DOWN | EXPOSURE |
| ← IN | | | |
| MOVE-UP | OUT → | | |
| ← OUT | | | EXPOSURE |
| IN → | ← IN | | |
| MOVE-DOWN | MOVE-UP | OUT → | |
| PURGE | ← OUT | | EXPOSURE |
| MOVE-DOWN | IN → | ← IN | |
| OUT → | MOVE-DOWN | MOVE-UP | |
| | PURGE | ← OUT | EXPOSURE |
| ← IN | MOVE-DOWN | IN → | |
| MOVE-UP | OUT → | MOVE-DOWN | |
| ← OUT | | PURGE | EXPOSURE |
| IN → | ← IN | MOVE-DOWN | |
| MOVE-DOWN | MOVE-UP | OUT → | |
| PURGE | ← OUT | | EXPOSURE |
| MOVE-DOWN | IN → | ← IN | |
| OUT → | MOVE-DOWN | MOVE-UP | |
| | PURGE | ← OUT | EXPOSURE |
| ← IN | MOVE-DOWN | IN → | |
| MOVE-UP | OUT → | MOVE-DOWN | |
| ← OUT | | PURGE | EXPOSURE |
| | ← IN | MOVE-DOWN | |
| | MOVE-UP | OUT → | |
| | ← OUT | | EXPOSURE |
| | | ← IN | |
| | | MOVE-UP | |
| | | ← OUT | |

FIG. 10

```
              URL  | http://www.maintain.co.jp./db/input.html |

TROUBLE DB INPUT WINDOW

DATE  | 2000/3/15        |  ~404
    MACHINE  | * * * * * * * *  |  ~401
       FILE  | OPE. FAILURE (STARTING ERROR) | ~403
   S.N. S/N  | 465NS4580001     |  ~402
  EMERGENCY  | D                |  ~405
      STATE  | LED FLICKERING AFTER POWERED  |  ~406

SOLUTION  | RESTART: PRESS RED BUTTON     |  ~407

PROGRESS  | TEMPORARY SOLUTION DONE       |  ~408

[NEXT] [RESET]   ~410              ~411           ~412
   LINK TO RESULT                  SOFTWARE       OPERATION
   LIST DATABASE                   LIBRARY        GUIDE
```

FIG. 13

LOAD-LOCK CHAMBER AND EXPOSURE APPARATUS USING THE SAME

FIELD OF THE INVENTION AND RELATED ART

This invention relates to a load-lock chamber suitably usable in an exposure apparatus which uses ultraviolet light as exposure light and which is arranged to replace the interior of the apparatus by an inactive gas and also which has a function for transferring a pattern of a mask onto a photosensitive substrate through a projection optical system, wherein the load-lock chamber is adapted to be operated continuously. In another aspect, the invention concerns an exposure apparatus having such a load-lock chamber and an exposure method that enables continuous operation.

Conventionally, the procedure of manufacturing semiconductor devices comprising very fine patterns such as LSI or VLSI uses a reduction type projection exposure apparatus which functions to project and photoprint, in a reduced scale, a circuit pattern formed on a mask onto a substrate being coated with a photosensitive material Increases in the density of the semiconductor device have forced further miniaturization, and advancement in the resist process as well as improvement of the exposure apparatus to meet the miniaturization have been pursued.

The resolving power of an exposure apparatus can be improved by, for example, shortening the exposure wavelength used or by enlarging the numerical aperture (NA) of a projection optical system.

As regards the exposure wavelength, recently, in place of i-line (365 nm), KrF excimer lasers having an emission wavelength of about 248 nm or ArF excimer lasers having an emission wavelength of about 193 nm have been developed. Further, fluorine ($F_2$) lasers having an emission wavelength of about 157 nm are being developed.

In regard to deep ultraviolet light, particularly, ArF excimer lasers having a wavelength of about 193 nm or $F_2$ excimer lasers having an emission wavelength of about 157 nm, it is known that there is an oxygen ($O_2$) absorption band in the regions about these wavelengths For example, because of its short wavelength (157 nm), the applicability of fluorine excimer lasers to exposure apparatuses have been attempted. However, the wavelength of 157 nm is present in a range of a wavelength region generally called a vacuum ultraviolet. In such wavelength region, the absorption of light by oxygen molecules is large. As a result, the atmosphere does not transmit most of the light. Therefore, this light source can be used only in a situation that the atmospheric pressure is reduced close to vacuum and that the oxygen concentration is sufficiently lowered. According to "Photochemistry of Small Molecules", Hideo Okabe, A Wiley-Interscience Publication, 1978, p178, the absorption coefficient of oxygen to light of a wavelength 157 nm is about 190 $atm^{-1} cm^{-1}$. This means that, when light of a wavelength 157 nm passes through a gas having an oxygen concentration of 1%, under a unit atmospheric pressure, the transmission factor T per 1 cm is only:

$$T = \exp(-190 \times 1\ cm \times 0.01\ atm) = 0.150.$$

Further, as the oxygen absorbs the light, ozones ($O_3$) are produced. Various products are created by ozones, and they are deposited to surfaces of optical elements to decrease the efficiency of the optical system.

In consideration of them, in projection exposure apparatuses which use deep ultraviolet rays such as an ArF excimer laser or a $F_2$ excimer laser, purging means such as an inactive gas (e.g., nitrogen or an inert gas) is provided at the light path of an exposure optical system, to suppress the oxygen concentration at the light path to a low level of an order of a few ppm or less.

As described above, in exposure apparatuses using deep ultraviolet light, particularly, an ArF excimer laser having a wavelength of about 193 nm or a fluorine ($F_2$) excimer laser having a wavelength of about 157 nm, because the ArF excimer laser light or $F_2$ excimer laser light is very easily absorbed by a substance, the light path must be purged to a level of an order of a few ppm or less. Further, this is also the case with the moisture ($H_2O$). It should be reduced to a level of a ppm order.

In order to meet this, conventionally, the inside of an exposure apparatus, more particularly, the portion thereof defined for a light path of ultraviolet light, is purged by use of an inactive gas. Further, a load-lock mechanism is provided at a portion for connecting the inside of the exposure apparatus with the outside thereof. When a reticle or a wafer is to be loaded from the outside, the outside atmosphere is once isolated by the load-lock mechanism. After impurities inside the load-lock mechanism are purged by an inactive gas, the reticle or wafer is introduced into the exposure apparatus.

FIG. 1 is a schematic and sectional view of an example of a semiconductor exposure apparatus having a fluorine ($F_2$) excimer laser as a light source and also a load-lock mechanism.

Denoted in FIG. 1 at 1 is a reticle stage on which a reticle having a pattern formed thereon is placed. Denoted at 2 is a projection optical system for projecting the pattern of the reticle onto a wafer. Denoted at 3 is a wafer state for carrying a wafer thereon and being movable in the X, Y, Z, θ and tilt directions. Denoted at 4 is an illumination optical system for projecting illumination light onto the reticle, and denoted at 5 is a light directing optical system for directing light from the light source to the illumination optical system 4. Denoted at 6 is a fluorine ($F_2$) excimer laser unit which is a light source, and denoted at 7 is a masking blade operable to block exposure light so as to prevent those regions on the reticle, other than a pattern region thereof, from being irradiated with the exposure light. Denoted at 8 and 9 are casings for encircling an exposure optical axis around the reticle stage 1 and the wafer stage 3. Denoted at 10 is a He gas conditioning machine for adjusting the inside of the illumination optical system 4 and the projection optical system 2 to provide there a predetermined He ambience. Denoted at 11 and 12 are $N_2$ gas conditioning machines for adjusting the inside of the casings 8 and 9 to provide there a predetermined $N_2$ ambience. Denoted at 13 and 14 are a reticle load-lock and a wafer load-lock, respectively, to be used when a reticle and a wafer are to be loaded into the casings 8 and 9, respectively. Denoted at 15 and 16 are a reticle hand and a wafer hand, respectively, for conveying a reticle and a wafer, respectively. Denoted at 17 is a reticle alignment mark to be used for adjusting the position of the reticle. Denoted at 18 is a reticle storage unit for storing plural reticles inside the casing 8. Denoted at 19 is a prealignment unit for performing prealignment of a wafer.

FIG. 2 is a schematic and sectional view of another example of a semiconductor exposure apparatus having a fluorine ($F_2$) excimer laser as a light source and also a load-lock mechanism.

In the exposure apparatus of FIG. 2, the exposure apparatus as a whole is covered by a casing 20, and $O_2$ and $H_2O$ there are purged by a $N_2$ gas. Denoted at 21 is an $N_2$ gas conditioning machine for providing a $N_2$ ambience in the whole casing 20. In this exposure apparatus, the inside spaces of a barrel 2 and an illumination optical system 4 are isolated from the inside space of the casing 20 (driving system space), and they are adjusted independently so that a He ambience is provided there. Denoted at 13 and 14 are a reticle load-lock and a wafer load-lock, respectively, to be used when a reticle and a wafer are loaded into the casings 8 and 9, respectively.

FIG. 3 is a schematic view of an example of a semiconductor manufacturing system including an exposure apparatus such as shown in FIG. 1 or 2, as well as a coating and developing machine.

Denoted in FIG. 3 at 22 is a coating and developing machine including a coater unit for coating a wafer with a resist material, and a developing unit for developing a wafer after being exposed. Denoted at 23 is an exposure apparatus, and denoted at 24 is an interface unit operable for transfer of a wafer between the coating and developing machine 22 and the exposure apparatus 23. Denoted at 25 and 26 are in-line ports, and denoted at 28 and 29 are manual loading and unloading ports. Each of these ports is provided with a load-lock mechanism as well as a function for introducing a $N_2$ gas. At a prealignment unit 19, for prevention of inaccurate measurement due to expansion or contraction of a wafer, the prealignment operation is performed to a wafer being controlled at a predetermined temperature. Denoted at 27 is a wafer temperature adjusting unit for adjusting a wafer to a predetermined temperature described above.

As has been described hereinbefore, in an exposure apparatus using ultraviolet light, more particularly, ArF excimer laser light or fluorine ($F_2$) excimer laser light, since absorption of light at the wavelength close to the emission wavelength of the ArF excimer laser light or $F_2$ excimer laser light, by oxygen or moisture, is large, the oxygen and moisture content concentration should be lowered so as to obtain a sufficient transmission factor and a good stability. In order to control the concentration of them exactly, a load-lock mechanism is provided in a portion connecting the inside and outside of the exposure apparatus. When a reticle or a wafer is to be loaded from the outside, it is once isolated from the outside temperature. After impurities within the load-lock mechanism are purged by an inactive gas, the reticle or the wafer is introduced into the exposure apparatus.

As described, conventionally, in order to assure a good transmission factor to fluorine ($F_2$) excimer laser light and a good stability thereof, a wafer stage (or a reticle stage) as a whole, containing a projection lens end face and a distance measuring interference optical system, is accommodated in a gas-tightly closed chamber. The inside of the chamber is purged by a high-purity inactive gas. Additionally, in order that a reticle or a wafer can be loaded into the closed chamber while maintaining a constant inactive gas concentration or a constant gas pressure inside the chamber, a load-lock chamber is provided adjacent the closed chamber. However, the load-lock chamber has a volume for accommodating about ten to twenty wafers therein, and the purging by an inactive gas is carried out while plural wafers are stored therein. It requires therefore a long time until a predetermined inactive gas concentration is accomplished. This leads to a decreased productivity of the exposure apparatus.

Further, the load-lock chamber requires a door for strictly isolating the outside atmosphere. It takes a substantial time for the opening and closing motion of the door. Also, the need for a space for the opening and closing motion of the door makes the whole size of the apparatus bulky.

It is therefore desirable to develop a load-lock mechanism by which the volume of the space for accommodation of wafers can be made very small, by which the purge time required until a predetermined inactive gas ambience is accomplished can be shortened, by which degradation of the inactive gas concentration in the load-lock chamber can be avoided, and by which the productivity of the apparatus can be improved

SUMMARY OF THE INVENTION

It is accordingly an object of the present invention to provide a continuous load-lock chamber to be suitably used in an exposure apparatus which uses ultraviolet light as exposure light, in which the inside of the apparatus is replaced by an inactive gas, and in which a pattern of a mask is transferred, by projection exposure, onto a photosensitive substrate through a projection optical system.

In accordance with an aspect of the present invention, there is provided a load-lock chamber for loading and unloading a reticle or a wafer into and out of an exposure apparatus, comprising: a table having a slotted flat plane for carrying thereon one or more reticles or wafers; a combination of an elevation shaft and an elevation driving unit, for moving said table upwardly and downwardly; a receiving bore for receiving said table with a small clearance maintained between the bore and a side wall of said table; and a load-lock chamber main assembly operable to move said table into said bore and to accommodate or discharge said table with a reticle or a wafer being carried thereon.

In one preferred form of this aspect of the present invention, the load-lock chamber may further comprise one or more purging inactive gas flowpassages provided on a side face of the bore of said load-lock chamber main assembly, to be opposed to said table, so that an inactive gas can be supplied to the slotted flat plane of said table, for carrying a reticle or a wafer thereon.

The one or more purging inactive gas flowpassages may be disposed radially around the bore of said load-lock chamber main assembly.

Each of said purging inactive gas flowpassages may have a purging inactive gas supplying port and a purging inactive gas outlet port The load-lock chamber may further comprise one or more purging inactive gas flowpassages provided on a side face of said table, to be opposed to the bore of said load-lock chamber main assembly, so that an inactive gas can be supplied to the slotted flat plane of the table for carrying thereon a reticle or a wafer.

The load-lock chamber may further comprise one or more inactive gas grooves for static pressure bearing, provided on a side face of said table to be opposed to the bore of said load-lock chamber main assembly, so as to enable non-contact movement of said table, while preventing flow of an outside air into the space of the slotted flat plane during the gas purging.

The or each inactive gas groove may be an annular groove formed around said table.

The load-lock chamber may further comprise one or more inactive gas grooves for static pressure bearing, provided on a side face of the bore of said load-lock chamber main assembly, to be opposed to said table, so as to enable non-contact movement of said table, while preventing flow of an outside air into the space of the slotted flat plane during the gas purging.

The or each inactive gas groove may be an annular groove formed around the bore of said load-lock chamber main assembly.

Here, the static pressure bearing gas groove may be omitted. The small clearance between the bore and the table may be assured by a separate bearing structure. A labyrinth seal groove may be formed on one of or both of opposed faces of the bore and the table, to enable non-contact motion of the table, while preventing flow of an outside air into the space of the slotted flat plane during the gas purging.

Further, the load-lock chamber main assembly may have a cylindrical shape.

The elevation shaft may be rotatable.

In accordance with another aspect of the present invention, there is provided an exposure apparatus for transferring a pattern of a reticle onto a wafer through a projection optical system and by use of ultraviolet light as exposure light, wherein the inside of said apparatus is replaced by an inactive gas, characterized by a load-lock chamber as recited above, for loading and unloading a reticle or a wafer into or out of said apparatus.

In one preferred from of this aspect of the present invention, the number of said load-lock chamber may be single, and wherein said load-lock chamber may function both for the loading and unloading of the reticle or the wafer.

The number of said load-lock chamber may be two or more, wherein each of the two or more load-lock chambers may function both for the loading and unloading the reticle or the wafer, or the two or more load-lock chambers function for the loading and the unloading of the reticle or the wafer, respectively.

The ultraviolet light may be laser light from a laser light source.

The laser light source may be a fluorine excimer laser.

The laser light source may be an ArF excimer laser.

The inactive gas for replacing a light path of the exposure light may contain one of nitrogen, helium and argon.

The exposure apparatus may further comprise purging means effective to fill the inside of said apparatus with an inactive gas.

In accordance with a further aspect of the present invention, there is provided an exposure method for transferring a pattern of a reticle onto a wafer through a projection optical system and by use of ultraviolet light as exposure light, wherein the inside of an apparatus is replaced by an inactive gas, characterized by use of a load-lock chamber as recited above, for loading and unloading a reticle or a wafer into or out of the apparatus.

In one preferred form of this aspect of the present invention, one or more load-lock chambers may be used, wherein the or each load-lock chamber may function both as a loading port and an unloading port.

Plural load-lock chambers may be used each being operable both as a loading port and an unloading port, wherein the load-lock chambers may be used with a shift at every step for the loading and unloading, to thereby enable successive exposures.

Plural load-lock chambers may be used separately as an exclusive loading port and an exclusive unloading port, respectively.

The load-lock chambers having a function as an exclusive loading port may have a plurality of slots which are used while being shifted at each step, wherein the load-lock chambers having a function as an exclusive unloading port may have a plurality of slots which are used while being shifted at each step, whereby successive exposures are enabled.

The exposure method may further comprise (i) loading a reticle or a wafer into a load-lock chamber, (ii) moving an elevation table upwardly or downwardly, (iii) purging the inside of the load-lock chamber, (iv) unloading the reticle or the wafer and moving it into an exposure apparatus.

In accordance with a yet further aspect of the present invention, there is provided a semiconductor device manufacturing method, comprising the steps of: providing a group of production machines for various processes, including an exposure apparatus as recited above, in a semiconductor manufacturing factory; and producing a semiconductor device through plural processes using the production machine group.

The method may further comprise (i) connecting the production machines of the group with each other through a local area network, and (ii) executing data-communication concerning information related to at least one production machine of the production machine group, between the local area network and an external network outside the semiconductor manufacturing factory.

A database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

In accordance with a still further aspect of the present invention, there is provided a semiconductor manufacturing factory, comprising: a group of production machines for various processes, including an exposure apparatus as recited above; a local area network for connecting the production machines of the production machine group with each other; and a gateway for enabling an access from the local area network to an external network outside the factory; wherein information related to at least one production machine in the group can be data communicated by use of the local area network and the gateway.

In accordance with a yet further aspect of the present invention, there is provided a method of executing maintenance for an exposure apparatus as recited above and being provided in a semiconductor manufacturing factory, said method comprising the steps of: preparing, by a vendor or a user of the exposure apparatus, a maintenance database connected to an external network outside the semiconductor manufacturing factory; admitting an access from the semiconductor manufacturing factory to the maintenance database through the external network; and transmitting maintenance information stored in the maintenance database to the semiconductor manufacturing factory through the external network.

The exposure apparatus may further comprise a display, a network interface and a computer for executing a network software, wherein maintenance Information related to said exposure apparatus is data communicated through the computer network.

The network software may provide on the display a user interface for accessing a maintenance database prepared by a vendor or a user of said exposure apparatus and connected to an external network outside a factory where said exposure apparatus is placed, thereby to enable obtaining information from the database through the external network.

The load-lock chamber described above may further comprise a labyrinth seal groove formed on one or or both of a side face of the bore of said load-lock chamber main assembly and a side face of said table to be opposed to the bore.

The labyrinth seal groove may comprise a plurality of annular grooves.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a diagram for explaining a conventional loading and unloading procedure, using two load-lock chambers.

FIG. 7 is a diagram for explaining a loading and unloading procedure, using two load-lock chambers, according to the present invention.

FIG. 10 is a diagram for explaining a loading and unloading procedure, using three load-lock chambers, according to the present invention.

FIG. 13 is a schematic view for explaining a specific example of a user interface.

DESCRIPTION OF THE PREFERRED EMBODIMENTS

It should be noted that exposure apparatuses to which a continuous load-lock chamber of the present invention is applicable are not limited. As long as it uses ultraviolet light as exposure light and the inside is replaced by an inactive gas and, also, it has a function for transferring a pattern of a mask onto a photosensitive substrate through a projection optical system, any one of known type exposure apparatuses is usable.

Also, ultraviolet light to be used as exposure light in an exposure apparatus according to the present invention is not limited. However, the present invention is suitable for use of deep ultraviolet light, more particularly, an ArF excimer laser having a wavelength of about 193 nm or a fluorine ($F_2$) excimer laser having a wavelength about 157 nm.

Preferred embodiments of the present invention will now be described with reference to the accompanying drawings.

[Embodiment 1]

Figure 4:
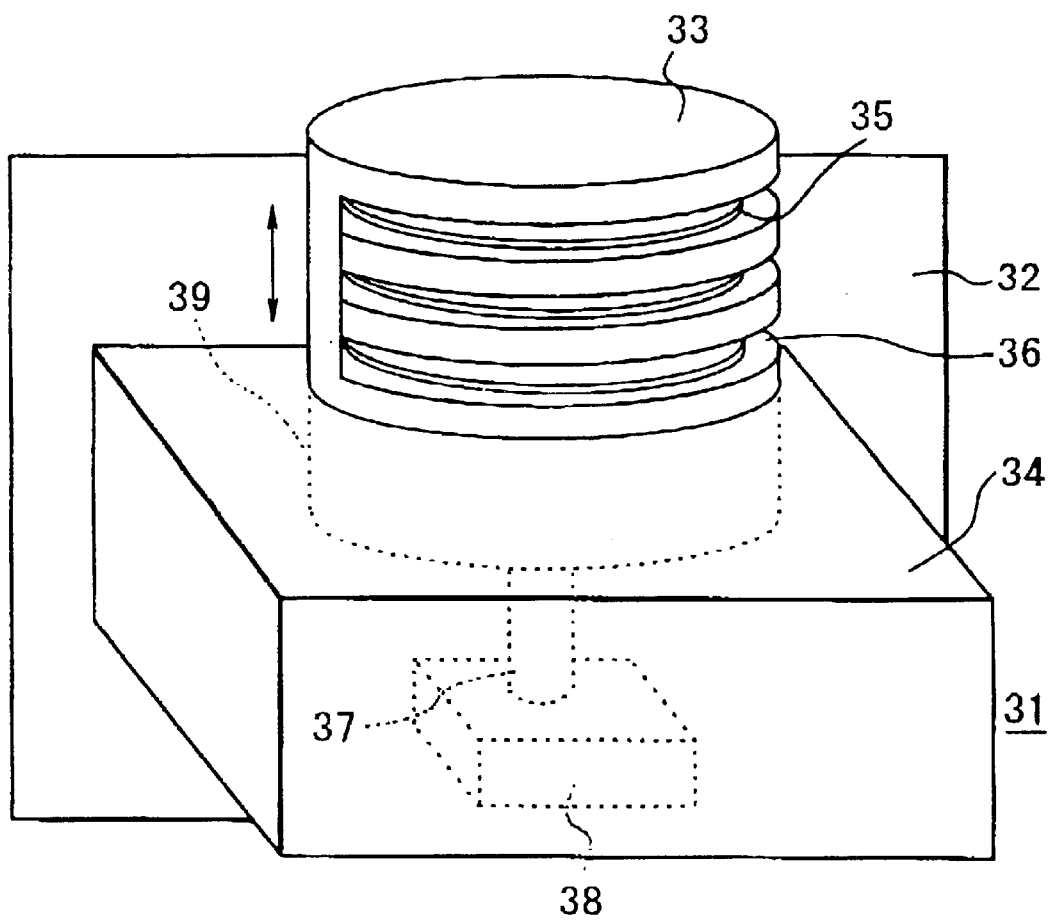
FIG. 4 is a perspective view of an example of a continuous load-lock chamber according to the present invention.

FIG. 4 is a perspective view of a general structure of a continuous load-lock chamber according to an embodiment of the present invention.

In FIG. 4, a continuous load-lock chamber 31 is provided while being internally connected to an exposure apparatus main assembly 32. A carrying table 33 has a cylindrical shape, and it can be fitted into a load-lock chamber main assembly 34. The table 33 has a plurality of slotted flat planes 36 for carrying reticles or wafers 35 thereon. The table 33 can be moved by a combination of an elevation shaft 37 and an elevation driving unit 38, so that it is accommodated into the exposure apparatus main assembly 32 or extracted out of the same. Further, by rotation of the elevation shaft 37, the orientation of the slotted flat plane 36 of the table 33 can be changed as desired. For example, a reticle or a wafer 35 is transferred thereto from a certain direction, and the orientation of the reticle or the wafer within the load-lock chamber main assembly 34 can be changed. After this, it can be conveyed toward the exposure apparatus main assembly 32, in a desired direction. The load-lock chamber main assembly 34 has a receiving bore 39 formed therein, for accommodating the table 33 of cylindrical shape with a small clearance for static pressure bearing thereto. In this manner, the table 33 can be moved into the bore 39, and the reticle or the wafer can be loaded into or unloaded out of the load-lock chamber main assembly 34.

Figure 5:
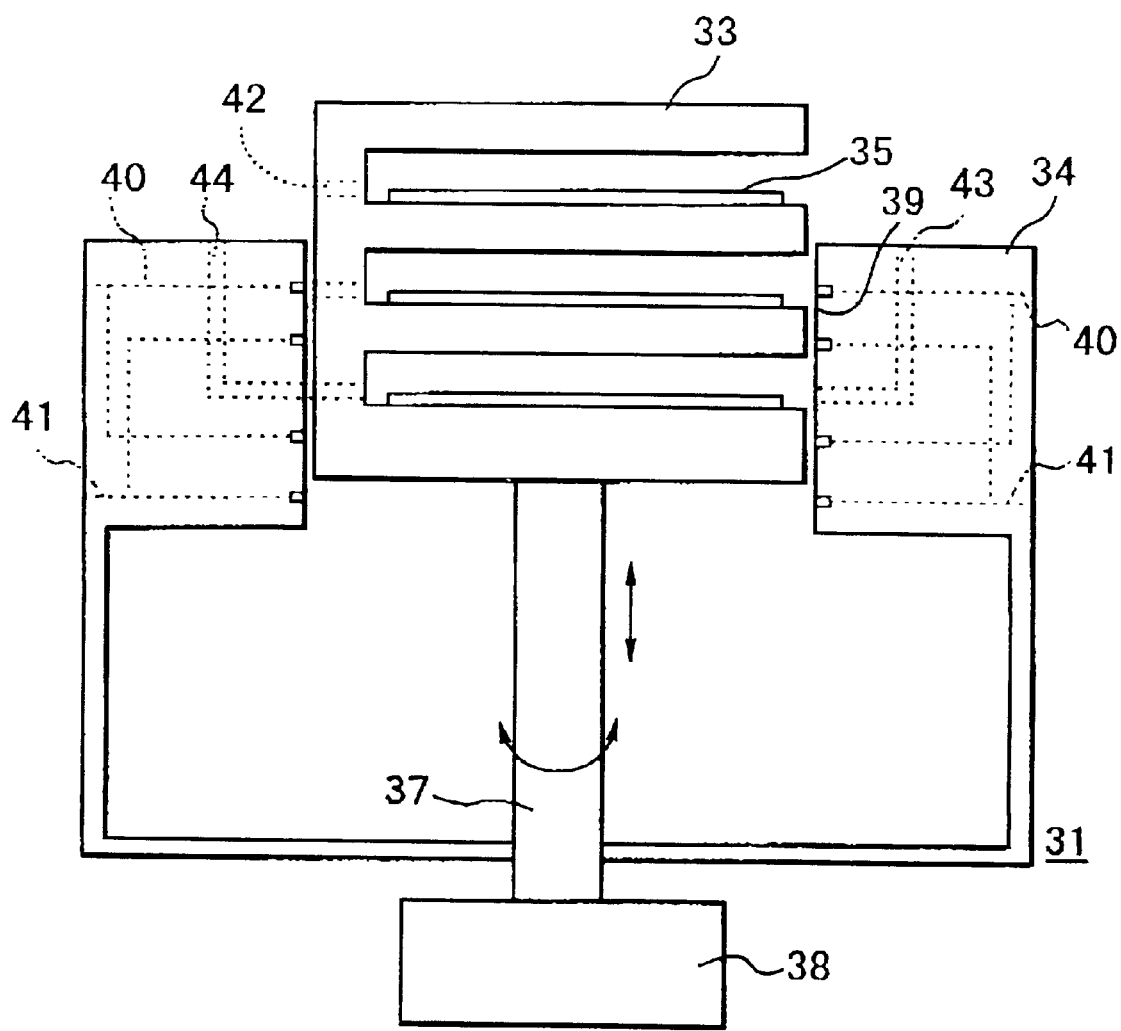
FIG. 5 is a sectional view of the continuous load-lock chamber of the FIG. 4 embodiment.

FIG. 5 is a sectional view, showing the internal structure of the FIG. 4 embodiment. The receiving bore 39 of the load-lock chamber main assembly 34 is provided with an inactive gas supply port 40 for static pressure bearing, and an inactive gas outlet port 41 for discharging the static pressure bearing inactive gas. Thus, a static bearing system is defined at the clearance between the table 33 and the bore 39. A reticle or a wafer 35 is placed on the table 33. The table 33 is rotatable through the elevation shaft 37 and the elevation driving unit 38, and also it can be moved upwardly and downwardly. Inside the load-lock chamber main assembly 34, impurities there are purged by an inactive gas. Before the table 33 is completely accommodated into the load-lock chamber main assembly 34, it is sufficiently purged by an inactive gas provided by means of a purging inactive gas supply port 43 and a purging inactive gas outlet port 44 formed on the bore 39, as well as a purge gas passage ports 42 formed on the wall of the table 33.

The provision of a static pressure bearing structure at the small clearance between the bore 39 and the table 33 has at least two advantages as follows.

Leakage of an outside air into the slotted flat planes 36 can be prevented. Therefore, a higher purity inactive gas purging can be made to the slotted flat planes.

Because of non-contact relative motion between the bore 39 and the table 33, heat generation or dust production resulting from friction can be avoided. This is very effective for controlling the wafer temperature constant. Also, adhesion of dust particles to the wafer can be reduced.

In place of the static pressure bearing structure described above, a small clearance between the bore 39 and the table 33 may be assured by a separate bearing structure, while a labyrinth seal groove having a plurality of annular grooves may be provided on one of or both of opposed faces of the bore 39 and the table 33 This structure similarly enables prevention of leakage of the outside air into the space of the slotted flat plane during the gas purging, and also non-contact motion of the table.

By using a continuous load-lock chamber shown in FIGS. 4 and 5, a procedure comprising (i) loading a substrate (reticle or wafer) into the load-lock chamber, (ii) moving the elevation table downwardly (upwardly), (iii) purging the inside of the load-lock chamber, (iv) unloading the substrate (reticle or wafer) and moving it into an exposure apparatus, can be done sequentially. A single continuous load-lock chamber may be provided in an exposure apparatus, and it may be used both for substrate loading and unloading. However, preferably two or more load-lock chambers may be provided and used exclusively for the substrate loading and unloading, respectively, for a better efficiency. Further, each of the loading and the unloading may be performed by use of two or more load-lock chambers, to facilitate a continuous operation, as will be described later.

Where a continuous load-lock chamber shown in FIGS. 4 and 5 is used, there may be a plurality of annular grooves and a gas supply port for supplying inactive gases to these grooves, which may be formed on one of or both of the side wall of the wafer carrying table of cylindrical shape, and the side wall of the receiving bore opposed to the outer periphery of the table with a small clearance maintained therebetween. Further, there may be a gas outlet disposed adjacent the annular groove having an inactive gas supply port, for discharging the supplied inactive gas therethrough. With this structure, dust production due to sliding motion can be avoided.

Until a wafer is loaded onto the wafer table from the outside, the side wall at one side of the table is fitted by the load-lock chamber bore, and the wafer carrying portion of the table is continuously purged by an inactive gas supplied from the annular grooves. As the a wafer is loaded, the wafer carrying portion of the table and the side wall at the other side thereof are exposed to the outside. After the wafer is loaded, the table is moved until the side wall of the table exposed to the outside is fitted by the load-lock chamber bore. At this time, the wafer loaded on the table is placed in an approximately closed space defined by the wall and the bore. Also, the gas tightness inside this space is kept by an inactive gas supplied from the annular groove. Under this condition, the closed space now accommodating a wafer therein is purged by an inactive gas. As the inactive gas concentration in this closed space reaches substantially the same level as that of the load-lock chamber, the wafer table is moved further so that the wafer is bought into the inside space of the load-lock chamber, and so the wafer is conveyed into the load-lock chamber.

At this time, the side wall at the other side of the wafer carrying table is fitted by the load-lock chamber bore, such that the inside gas tightness is maintained by the inactive gas supplied by the annular groove.

In this embodiment, a load-lock chamber as a separate structure may be omitted and, in place of it, a bore may be directly formed in a gas-tight chamber. This enables reduction in size and cost of the apparatus. Further, the wafer carrying table may be used for plural wafers If a plurality of wafer carrying tables are provided, the processing capacity will be improved more. For example, two carrying tables each being able to carry plural wafers thereon may be used. One of them may be used for the loading, and the other may be used for the unloading. This enables a substantially continuous processing operation to the whole wafers, even if the same is used for an in-line operation with a coating and developing machine, for example.

Further, in this embodiment, the wafer table has a cylindrical shape, and there is a rotationally driving mechanism used. With this structure, the direction for wafer loading and unloading between the outside of the load-lock chamber and the wafer carrying table as well as the direction for wafer loading and unloading between the wafer table and the closed space can be set as desired. Therefore, there is a large freedom or latitude for the layout of the exposure apparatus main assembly having the closed space and the load-lock chamber and a wafer conveying system outside the main assembly. The rotationally driving mechanism may be structured so as to rotate the whole wafer carrying table having a plurality of slots. Alternatively, it may be arranged to rotate plural slots independently. In that occasion, the rotation can be done in parallel to wafers in the other slots. This prevents prolongation of the processing time.

Moreover, since the conveying mechanism for loading and unloading a wafer into and out of the load-lock chamber is provided with an elevation driving mechanism, wafers of a predetermined number can be placed on plural wafer tables beforehand. Thus, inactive gas purging can be done to Plural wafers at once.

[Embodiment 2]

Figure 1:
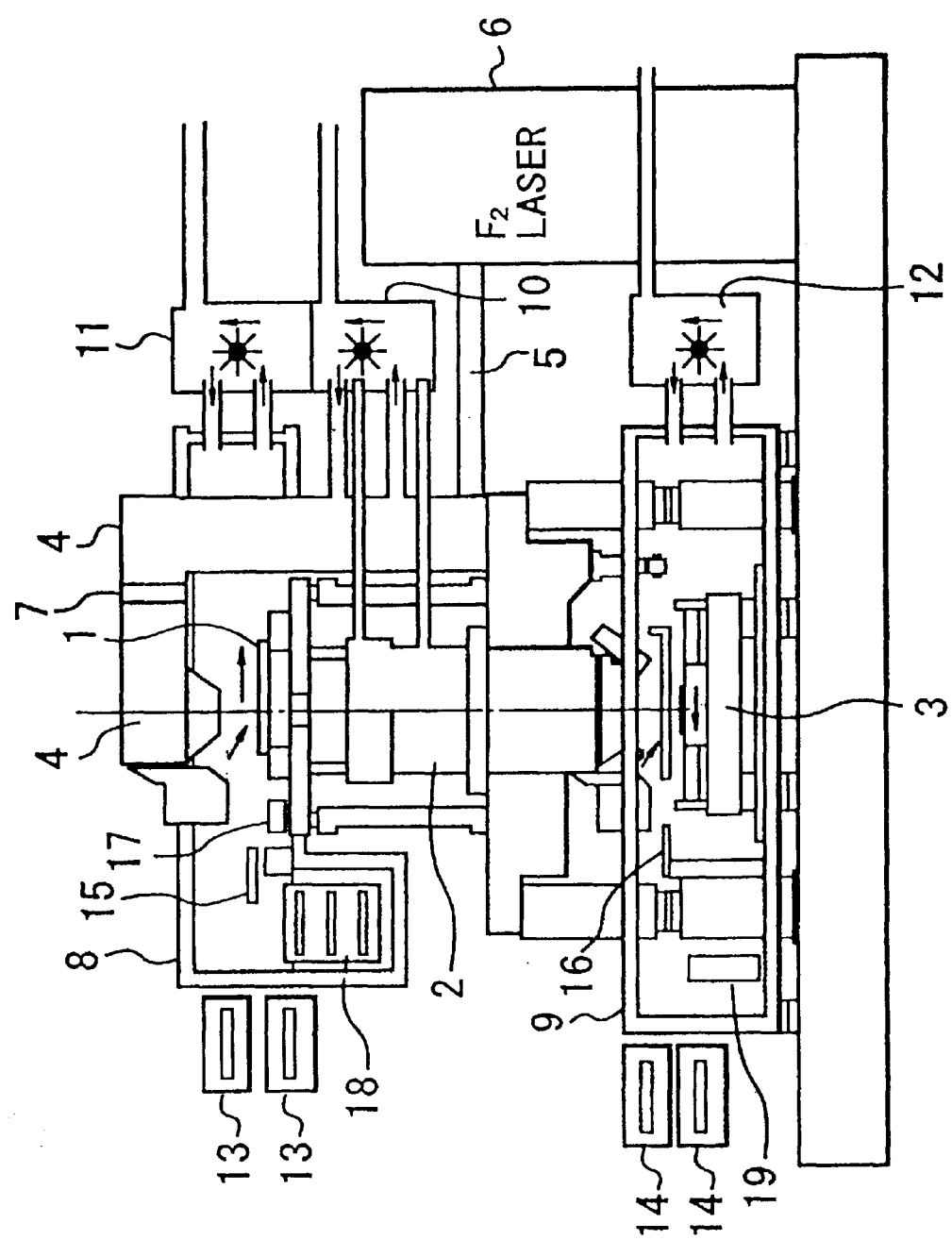
FIG. 1 is a schematic view of a general structure of a projection exposure apparatus to which a continuous load-lock chamber according to the present invention can be applied.
Figure 2:
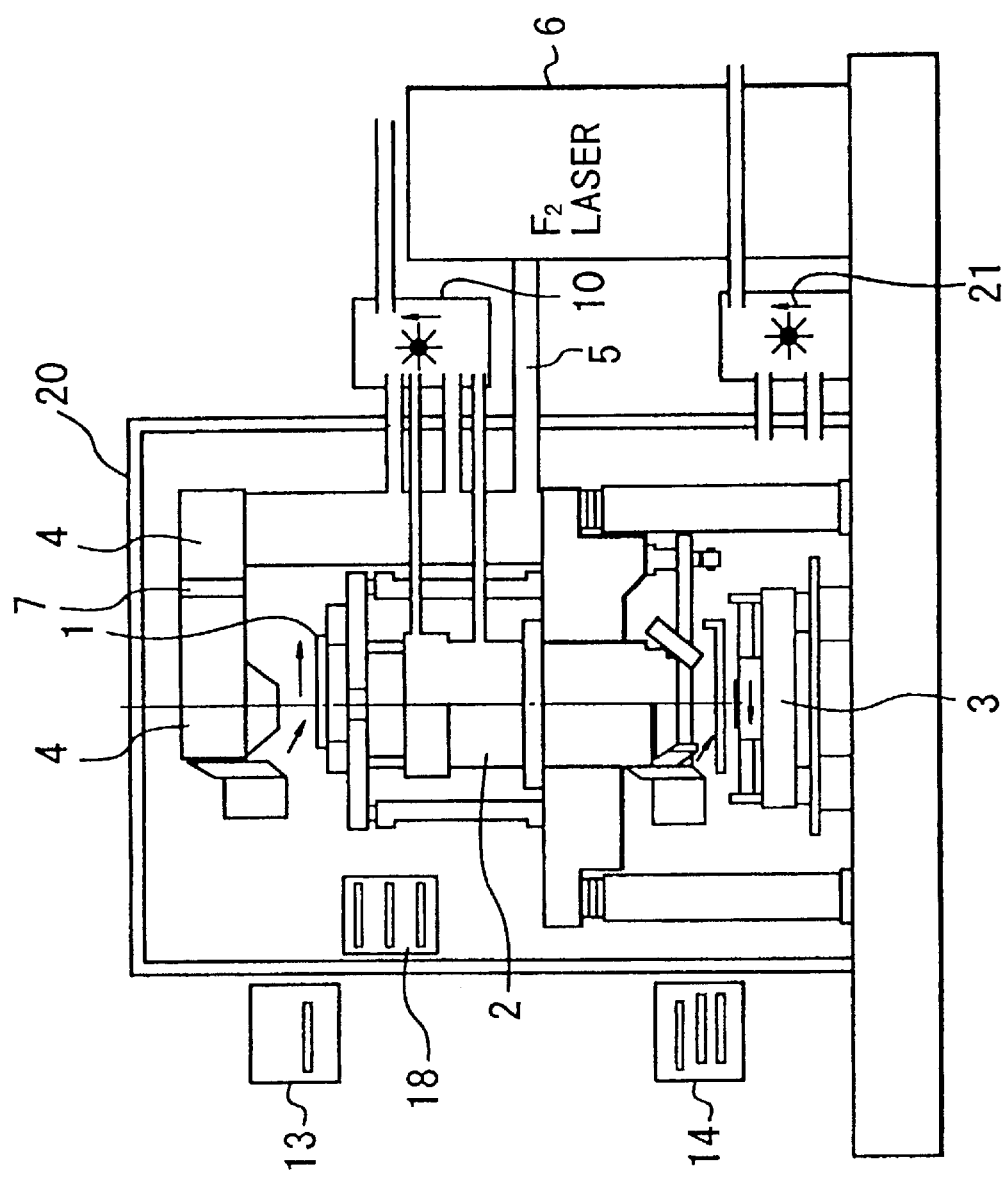
FIG. 2 is a schematic view of a general structure of another example of a projection exposure apparatus to which a continuous load-lock chamber according to the present invention can be applied.
Figure 3:
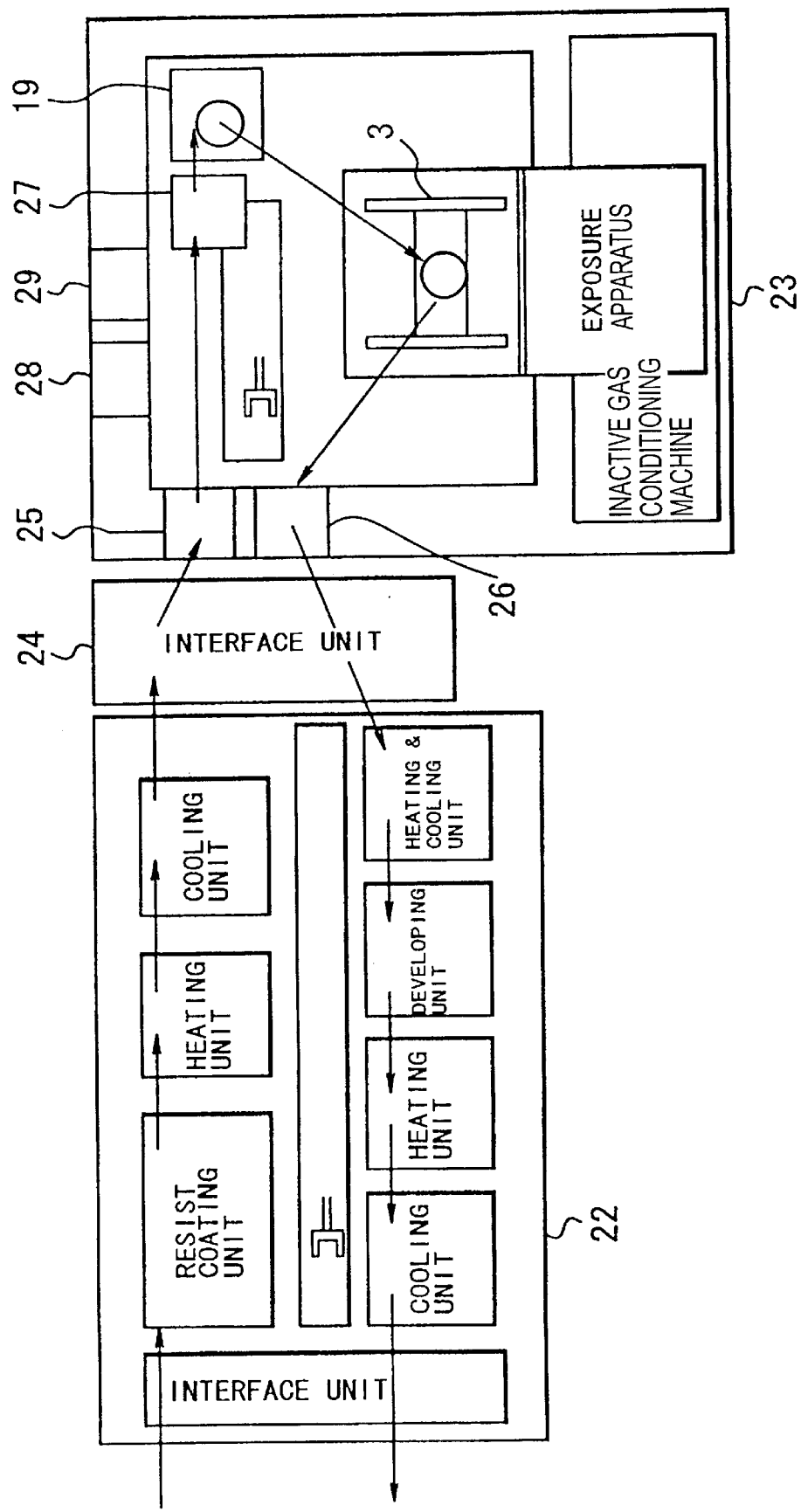
FIG. 3 is a schematic view of a general structure of a projection exposure apparatus and a coating and developing machine, to which a continuous load-lock chamber according to the present invention can be applied.

In this embodiment, a continuous load-lock chamber such as shown in FIGS. 4 and 5 is incorporated into an exposure apparatus such as shown in FIG. 1, 2 or 3. With this structure, the exposure process using a fluorine gas laser can be accomplished, at a sufficient transmission factor to exposure light and a good stability of the same.

This embodiment provides advantageous effects such as follows. First, because any door is unnecessary, there is no time required for the door opening and closing motion. Further, the space volume necessary for accommodating every wafer into a closed space can be made very small, and thus the purge time until a predetermined inactive gas ambience is accomplished can be shortened. Since the inactive gas concentration within the load-lock chamber is not degraded, the productivity of the apparatus is improved. Also, there is no need of a door for plural slots (wafer tables), the space required for the opening and closing motion is unnecessary. This enables reduction in size of the apparatus.

Second, a bore or opening may be directly formed in a wall, constituting a gas-tight chamber, and the bore may be used as a load-lock chamber. In that occasion, further reduction in size of the apparatus is enabled.

Third, the bore and the wafer table are formed with an approximately cylindrical shape. This effectively reduces the space volume of the load-lock chamber, and thus it shortens the purge time and increases the processing capacity.

Fourth, with the provision of a rotationally driving mechanism for the wafer carrying table, the freedom of the layout of the wafer conveying system to the main assembly is enlarged. The size of the apparatus as a whole can be made smaller.

The load-lock chamber of the present invention can be incorporated into an exposure apparatus which includes an in-line system having a coating and developing machine such as shown in FIG. 3. In that occasion, the time required from the resist coating to a wafer in the coating and developing machine to the exposure to be made in the exposure apparatus main assembly can be shortened. Also, the time necessary for developing a wafer, after being exposed by the exposure apparatus main assembly, by use of the coating and developing machine can be reduced. As a result, a high performance coating and developing operation is assured.

[Embodiment 3]

Next, the procedure according to an exposure method of the present invention will be described, in detail.

FIG. 6 illustrates the procedure for loading and unloading a substrate such as a reticle or a wafer, into and out of an exposure apparatus, by use of two load-lock chambers of conventional structure.

It is seen from FIG. 6 that, when a first loading and unloading port (carrying-in and -out port) 1 executes operations for substrate loading (carry-in), closing the front door, purge, opening the rear door, unloading (carry-out) the substrate into the exposure apparatus and so on, a second loading and unloading port (carrying-in and -out port) 2 which is another load-lock chamber performs operation for substrate loading (carry-in), closing the front door, purge, opening the rear door, unloading the substrate into the exposure apparatus and so on, with a delay of one step. The exposure operation to be done in the exposure apparatus main assembly is executed only at limited timing, and it is discontinuous and the efficiency is not good.

FIG. 7 illustrates the procedure for loading and unloading a substrate such as a reticle or a wafer into and out of an exposure apparatus, according to an embodiment of the present invention, to be done by use of two continuous load-lock chambers of the present invention. Each of the two load-lock chambers has four slots (levels) for accommodating substrates therein. One of them is used exclusively as a loading port (carrying-in port), while the other is used exclusively as an unloading port (carrying-out port). In this arrangement, the four slots 1–4 of the loading port 1 execute the operations for substrate loading (carry-in), downward motion, purge, downward motion, substrate unloading (carry-out) into the exposure apparatus and so one, with a delay of two or three steps. As a result of this, the exposure operations to be done inside the exposure apparatus main assembly are performed in steady state and at continuous or successive timing. Similarly, the four slots 1–4 of the unloading port (carrying-out port) 1 perform the operations of substrate loading, upward motion and unloading with a delay of three steps.

As a result, in this embodiment, the exposure process can be done very efficiently.

Figure 8A:
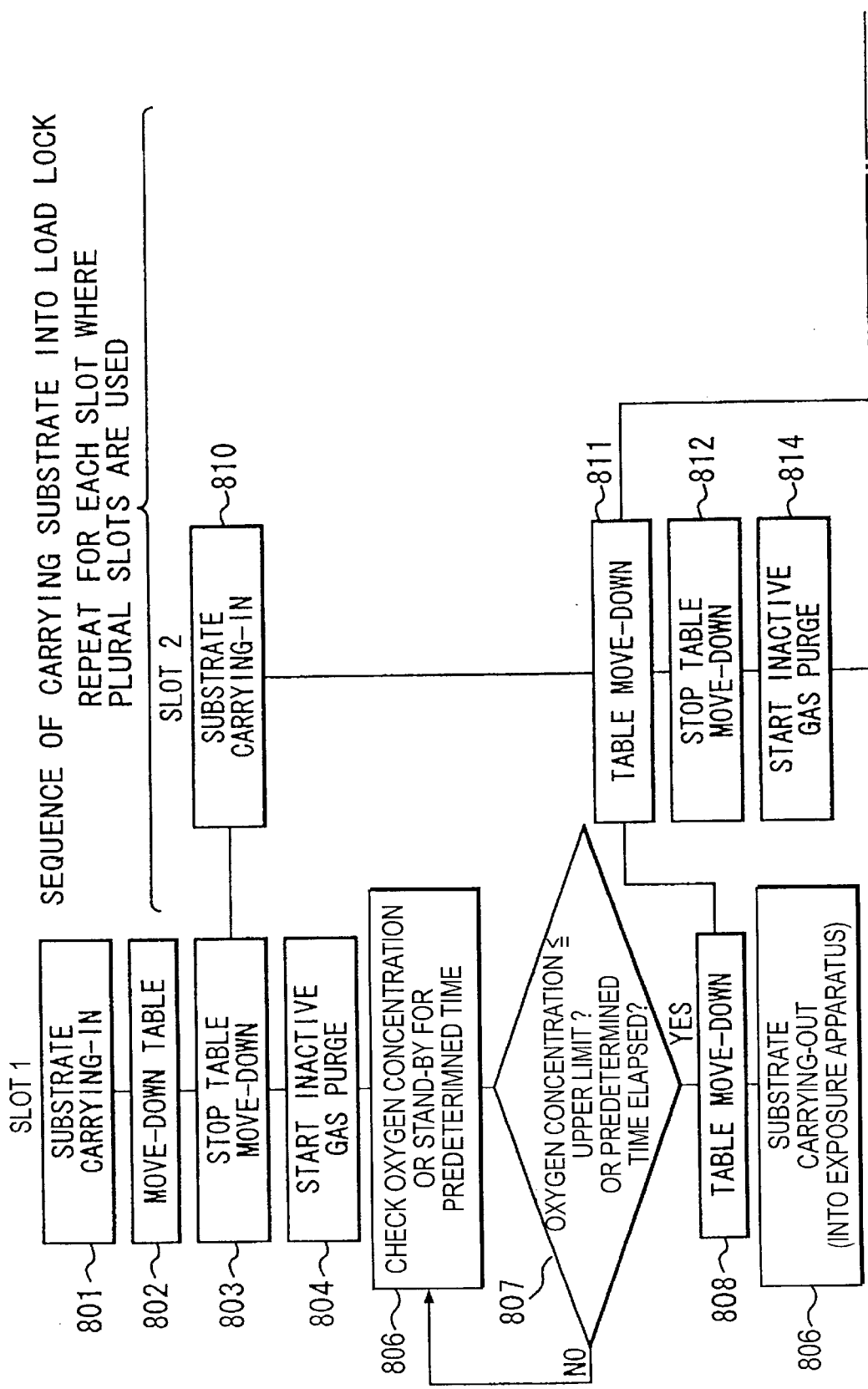
FIGS. 8A and 8B, is a flow chart for explaining the sequence of substrate loading into a load-lock chamber according to the present invention.
Figures 8, 8B:
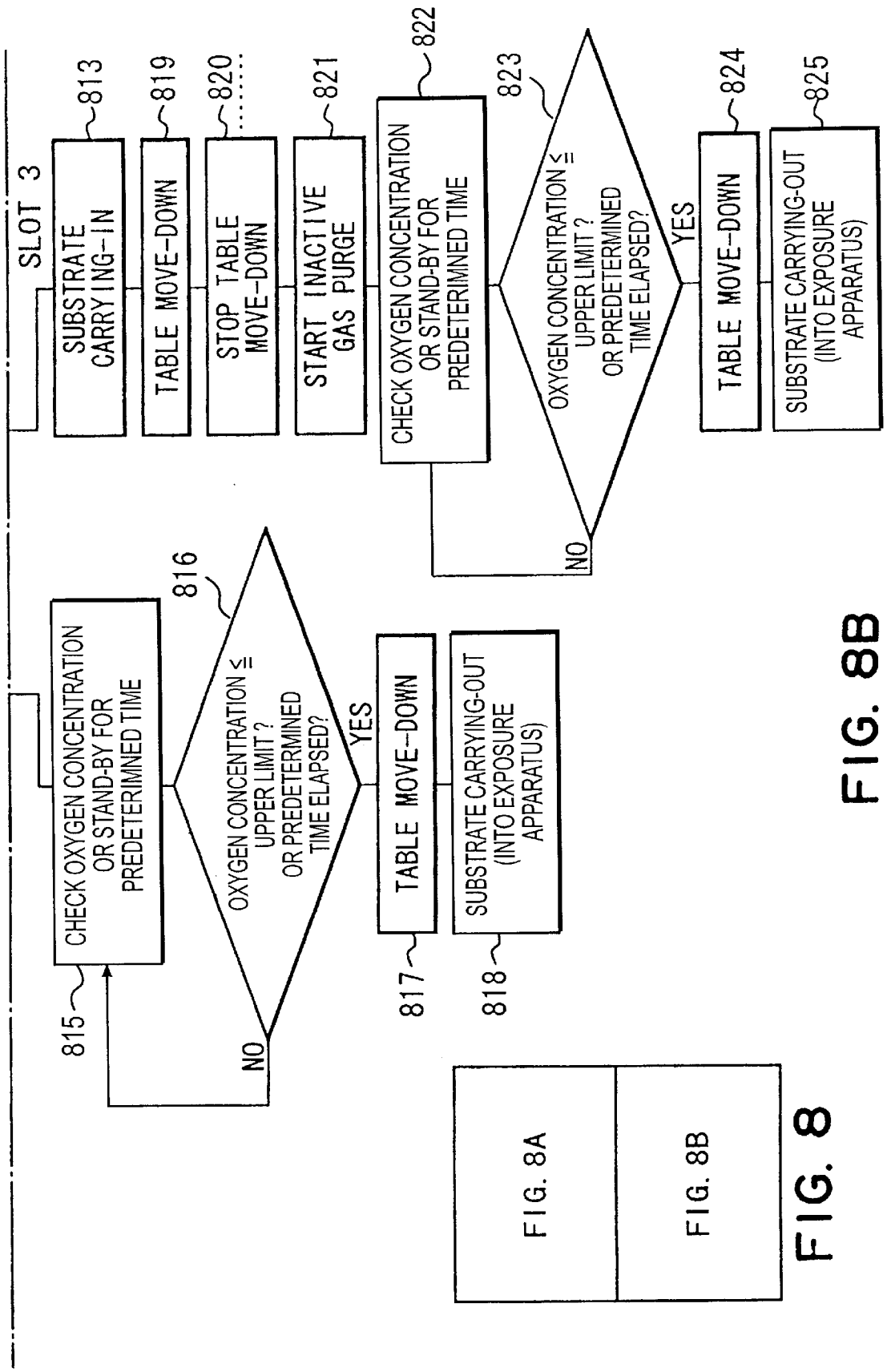
FIG. 8, including
Figure 9:
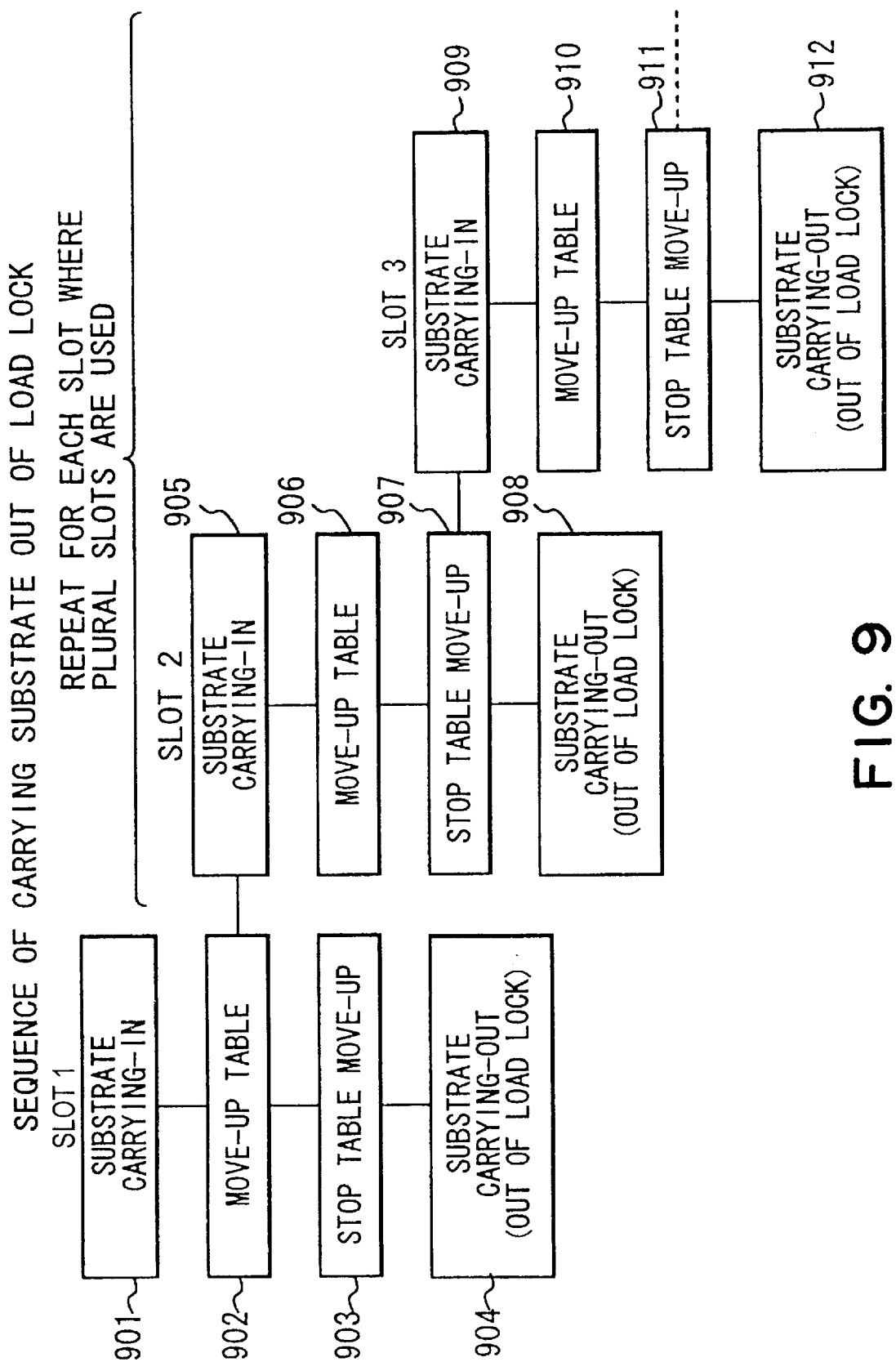
FIG. 9 is a flow chart for explaining the sequence of substrate unloading from a load-lock chamber according to the present invention.

FIG. 8 illustrates the actions of the slots where the first load-lock chamber operates to convey a substrate into the exposure apparatus main assembly. It is seen that the operations of these slots are repeated in steady state. Similarly, FIG. 9 illustrates the actions of the slots where the second load-lock chamber operates to convey a substrate out of the exposure apparatus main assembly. It is seen that the operations of the slots are repeated in steady state.

[Embodiment 4]

FIG. 10 illustrates the procedure for loading and unloading a substrate such as a reticle or a wafer into and out of an exposure apparatus, by use of three load-lock chambers of the present invention, wherein each load-lock chamber is used both for the substrate loading and unloading ports.

It is seen from FIG. 10 that, when the loading and unloading port (carrying-in and -out port) 1 performs the operations of substrate loading (carry-in), downward motion, purge, downward motion, substrate unloading (carry-out) into the exposure apparatus and so on, the remaining two load-lock chambers (ports 2 and 3) repeatedly execute the operations of substrate loading (carry-in), downward motion, purge, downward motion, substrate unloading (carry-out) into the exposure apparatus and so on, with a delay of one step. Therefore, the exposure process to be done in the exposure apparatus main assembly can be performed just at successive and steady state timing.

[Embodiment of Semiconductor Manufacturing System]

Next, an embodiment of a manufacturing system for semiconductor devices such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 11:
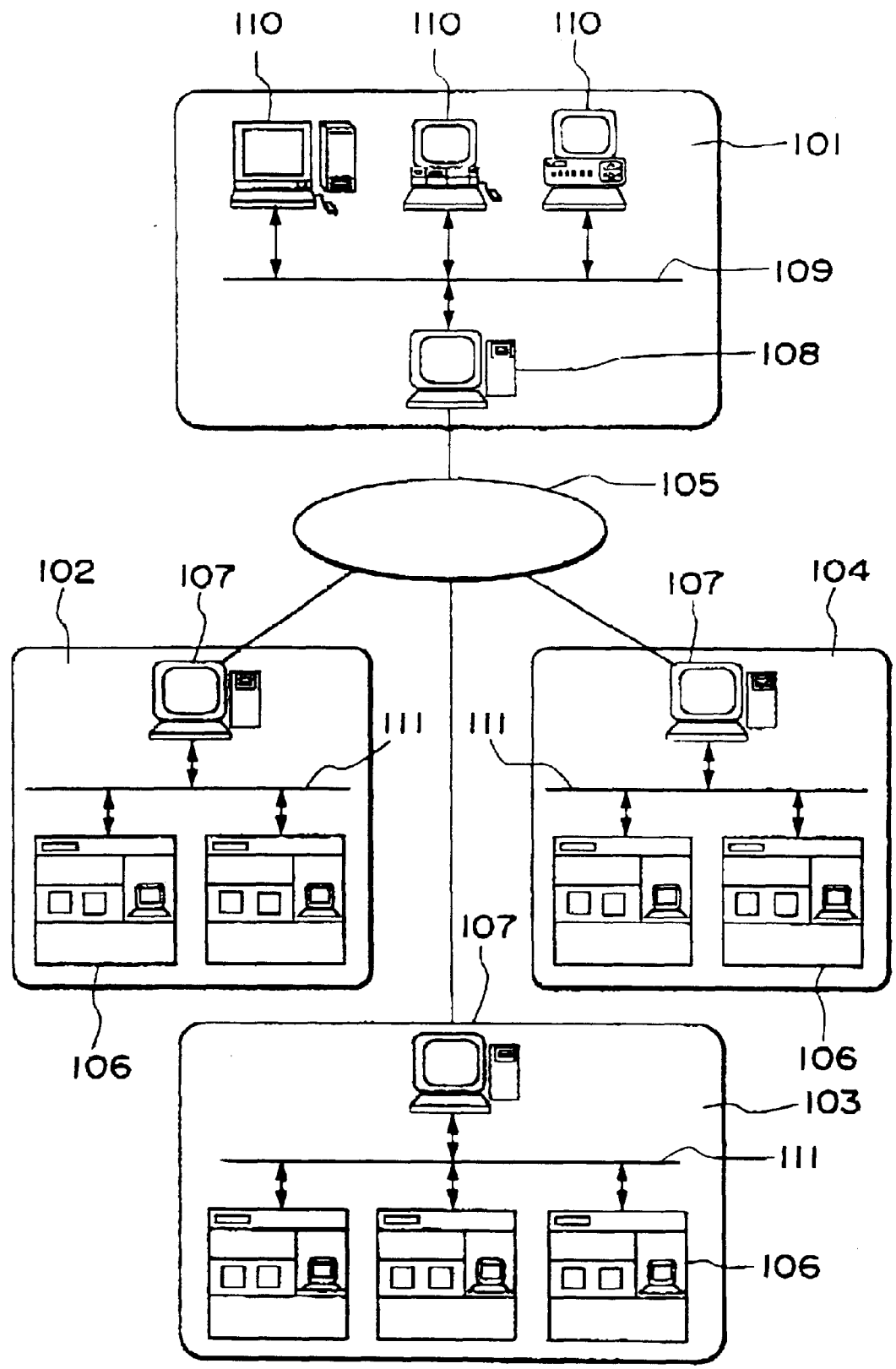
FIG. 11 is a schematic view of a semiconductor device manufacturing system, as viewed in a certain aspect thereof.

FIG. 11 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, a resist coating apparatus, an etching apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor The data communication between each factory 102–104 and the vendor 101 as well as the data communication through the LAN 111 in each factory, may use a communication protocol (TCP/IP) generally used in the internet. In place of using the internet, an exclusive line network (e.g., ISDN) controlled with a strictest security that an access of a third party is not allowed, may be used. Further, the host control system is not limited to the system as provided by the vendor. A database may be structured by the user and it may be set in an outside network, such that it can be accessed from plural user factories.

Figure 12:
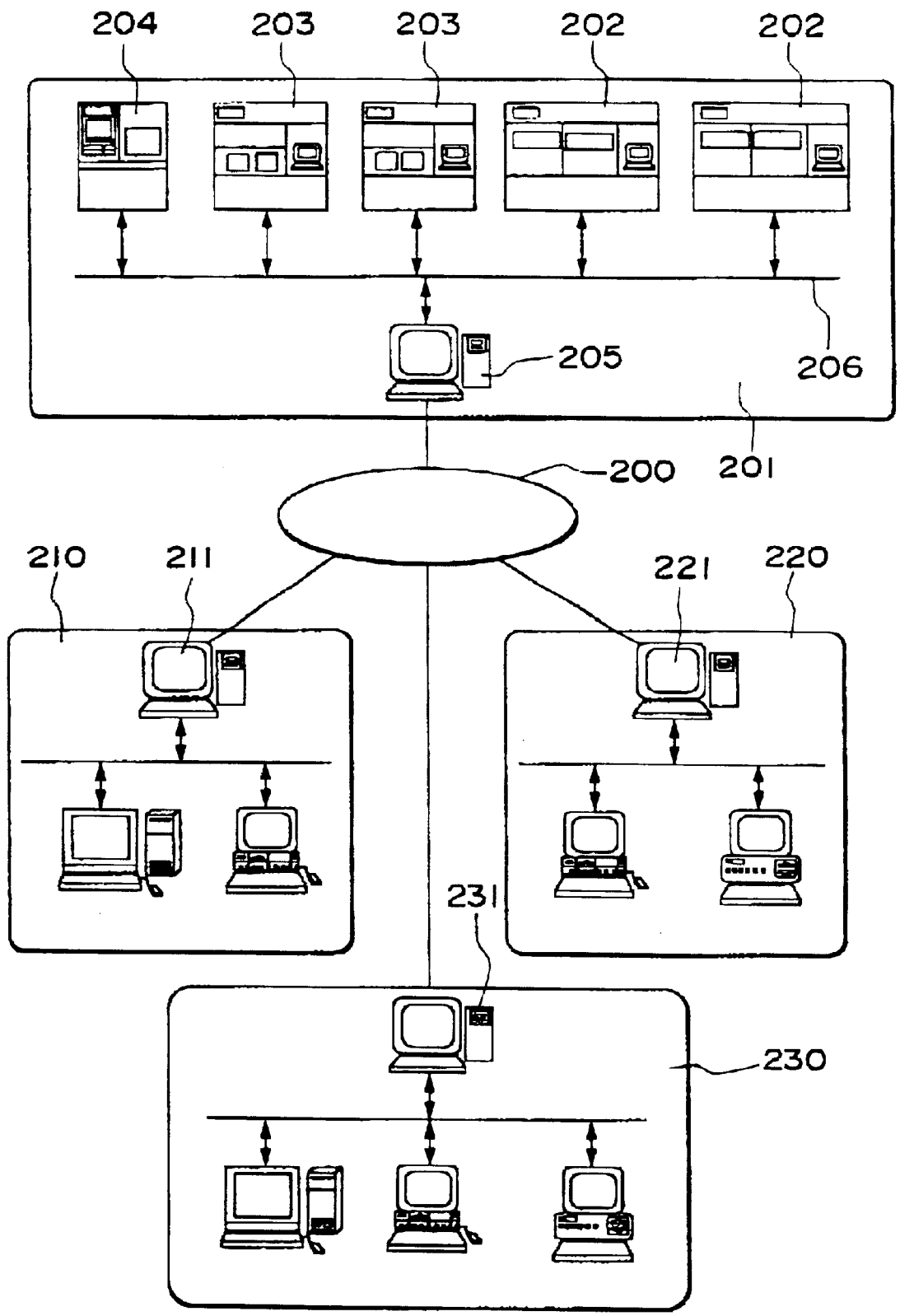
FIG. 12 is a schematic view of a semiconductor device manufacturing system, as viewed in another aspect thereof.

FIG. 12 is a schematic view of a general structure of the production system according to this embodiment, in another aspect thereof different from that of FIG. 11. In the preceding example, plural user factories each having production machines and the control system of the vendor of the production machines are connected with each other through an external network, so that, through this external network, information related to the production control in each factory or information related to at least one production machine can be data communicated In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet.

The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the Internet 200. Therefore, the suspension of the production line is short.

Each of the production machines in the factory may have a display, a network interface and a computer for executing network accessing softwares, stored in a storage device, as well as machine operating softwares. The storage device may be an internal memory or a hard disk or, alternatively, it may be a network file server. The network accessing softwares may include an exclusive or wide-use web browser, and an user screen interface such as shown in FIG. 13, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each items, or he/she can get a latest version software to be used for the production machine, from the software library as provided by the vendor. Alternatively, the operator can get an operation guide (help information) prepared for factory operators.

Next, a semiconductor device manufacturing process which uses the production system described above, will be explained.

Figure 14:
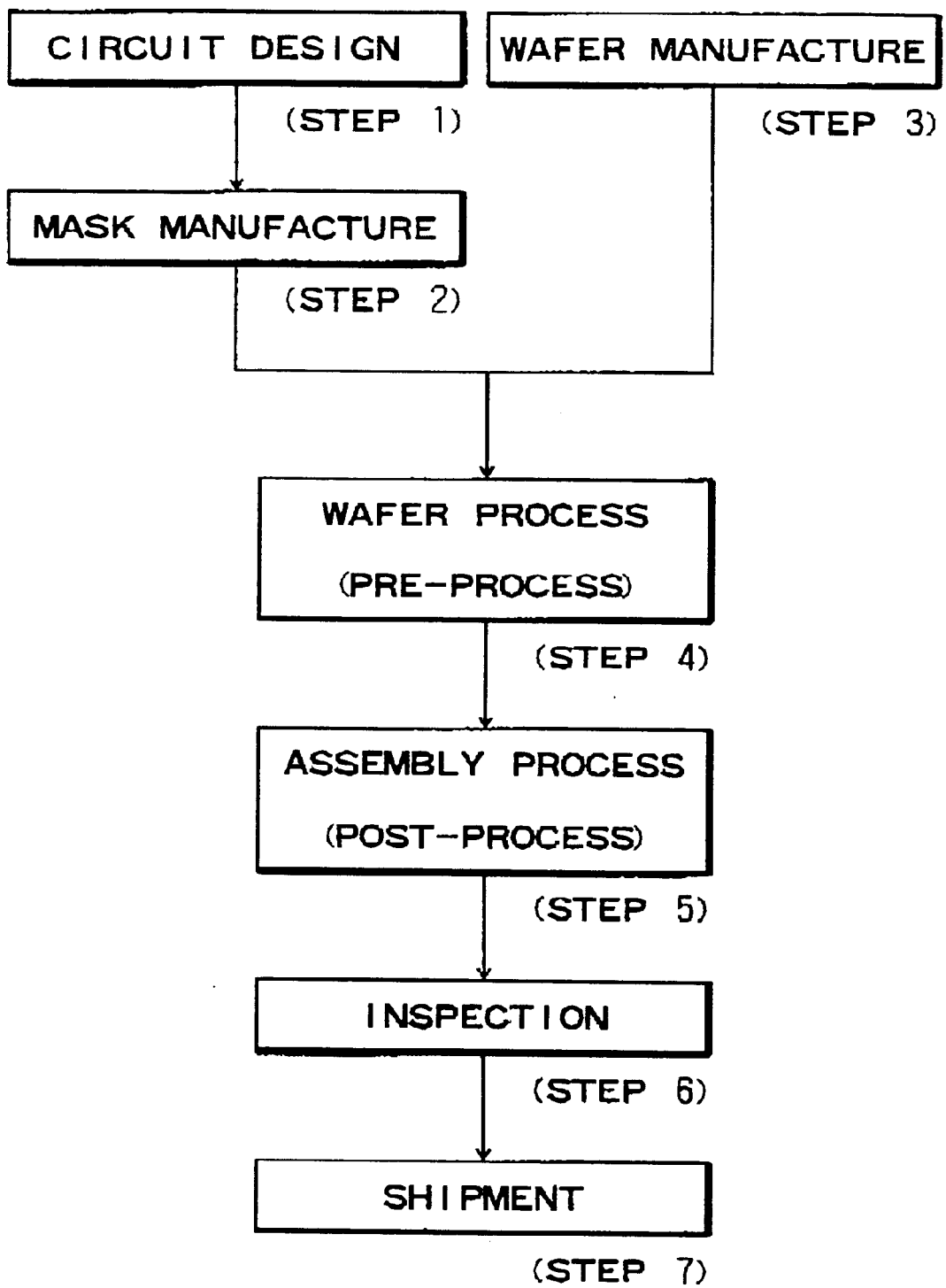
FIG. 14 is a flow chart of device manufacturing processes.

FIG. 14 is a flow chart of a general procedure for manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7)

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 15:
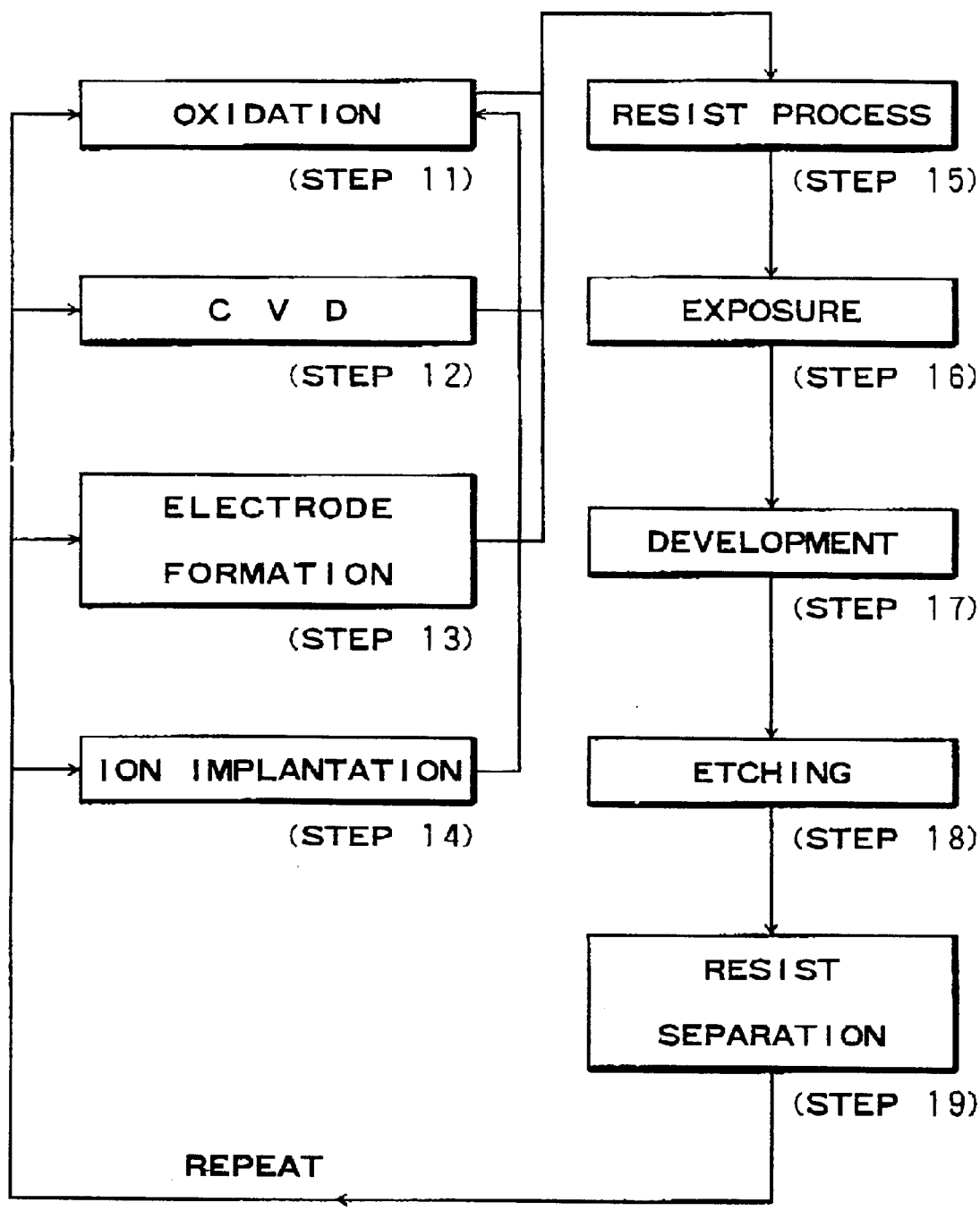
FIG. 15 is a flow chart for explaining details of a wafer process, included in the procedure of FIG. 14.

FIG. 15 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is An exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the present invention as described hereinbefore, in a projection exposure apparatus having a light source of ultraviolet light such as a fluorine excimer laser, for example, the size of a load-lock chamber for loading and unloading a substrate into and out of the apparatus can be made small. Also, continuous or successive operations are enabled Thus, high precision exposure is enabled, and formation of a very fine circuit pattern is facilitated.

While the invention has been described with reference to the structures disclosed herein, it is not confined to the details set forth and this application is intended to cover such modifications or changes as may come within the purposes of the improvements or the scope of the following claims.

What is claimed is:

1. A load-lock apparatus for loading and unloading an object, comprising:
   a table unit having a slot for carrying the object thereon;
   a chamber unit having a chamber and a throughbore through which said table unit can be loaded into and unloaded out of said chamber; and
   a driving unit for moving said table unit into and out of said chamber through said throughbore;
   wherein said table unit and said throughbore are arranged such that a passage which includes said slot and through which an inactive gas flows, is defined by said throughbore and at least a portion of said table unit loaded in said throughbore, and that the passage is purged by the inactive gas.

2. An apparatus according to claim 1, wherein a static pressure bearing structure for said driving unit is formed by said passage.

3. An apparatus according to claim 1, wherein a seal structure of said apparatus is formed by said passage.

4. An apparatus according to claim 1, wherein at least a portion of said passage is formed radially.

5. An apparatus according to claim 1, wherein said throughbore has a supply port and an outlet port for the inactive gas.

6. An apparatus according to claim 1, wherein said table unit has a portion effective to define said passage.

7. An apparatus according to claim 1, wherein said passage is defined by a groove provided on said throughbore.

8. An apparatus according to claim 1, wherein said table unit has a passage port for the inactive gas.

9. An apparatus according to claim 1, wherein said throughbore has a cylindrical shape.

10. An apparatus according to claim 1, further comprising a rotation unit for rotating said table unit.

11. A device manufacturing system, comprising:
    an exposure apparatus for transferring a pattern of a reticle onto a substrate, in which an atmosphere is replaced by an inactive gas; and
    a load-lock apparatus for loading and unloading one of the reticle and the substrate to or from said exposure apparatus, said load-lock apparatus including (i) a table unit having a slot for carrying thereon one of the reticle and the substrate, (ii) a chamber unit having a chamber and a throughbore through which said table unit can be loaded into and unloaded out of said chamber, and (iii) a driving unit for moving said table unit into and out of said chamber through said throughbore, wherein said table unit and said throughbore are arranged such that a passage which includes said slot and through which an inactive gas flows, is defined by said throughbore and at least a portion of said table unit loaded in said throughbore, and that the passage is purged by the inactive gas.

12. A device manufacturing system according to claim 11, wherein said system comprises a plurality of load-lock apparatuses each being as aforesaid.

13. A device manufacturing method, comprising:
    an exposure step of transferring a pattern of a reticle onto a substrate by use of an exposure apparatus in which an atmosphere is replaced by an inactive gas; and
    a loading/unloading step for loading and/or unloading one of the reticle and the substrate to or from the exposure apparatus, by use of a load-lock apparatus including (i) a table unit having a slot for carrying thereon one of the reticle and the substrate, (ii) a chamber unit having a chamber and a throughbore through which the table unit can be loaded into and unloaded out of the chamber, and (iii) a driving unit for moving the table unit into and out of the chamber through the throughbore, wherein the table unit and the throughbore are arranged such that a passage which includes the slot and through which an inactive gas flows, is defined by the throughbore and at least a portion of the table unit loaded in the throughbore, and that the passage is purged by the inactive gas.

14. A method according to claim 13, wherein a plurality of load-lock apparatuses each being as aforesaid are prepared and used.

15. A method according to claim 13, wherein said loading/unloading step includes (i) loading one of the reticle and the substrate into the table unit, (ii) moving the table unit into the chamber, (iii) purging the passage, and (iv) unloading the one of the reticle and the substrate out of the chamber and loading it into the exposure apparatus.

16. A device manufacturing method, comprising the steps of:
    providing a load-lock apparatus adapted for loading and/or unloading an object to or from a production apparatus in which an atmosphere is replaced by an inactive gas, in a manufacturing factory, wherein the load-lock apparatus includes (i) a table unit having a slot for carrying the object thereon, (ii) a chamber unit having a chamber and a throughbore through which the table unit can be loaded into and unloaded out of the chamber, and (iii) a driving unit for moving the table unit into and out of the chamber through the throughbore, wherein the table unit and the throughbore are arranged such that a passage which includes the slot and through which an inactive gas flows, is defined by the throughbore and at least a portion of the table unit loaded in the throughbore, and that the passage is purged by the inactive gas; and
    producing a device through a plurality of processes using the load-lock apparatus.

17. A device manufacturing factory, comprising:
    a production apparatus for manufacturing a device, in which an atmosphere is replaced by an inactive gas; and
    a load-lock apparatus for loading and unloading an object to or from said production apparatus, said load-lock apparatus including (i) a table unit having a slot for carrying the object thereon, (ii) a chamber unit having a chamber and a throughbore through which said table unit can be loaded into and unloaded out of said chamber, and (iii) a driving unit for moving said table unit into and out of said chamber through said throughbore, wherein said table unit and said throughbore are arranged such that a passage which includes said slot and through which an inactive gas flows, is defined by said throughbore and at least a portion of said table unit loaded in said throughbore, and that the passage is purged by the inactive gas.

* * * * *

UNITED STATES PATENT AND TRADEMARK OFFICE
CERTIFICATE OF CORRECTION

PATENT NO.    : 6,734,950 B2
DATED         : May 11, 2004
INVENTOR(S)   : Hitoshi Nakano It is certified that error appears in the above-identified patent and that said Letters Patent is hereby corrected as shown below:

Drawings:
Sheet 8, FIG. 8A, in step "806," "PREDETERIMNED"
should read -- PREDETERMINED --.
Sheet 9, FIG. 8B, in step "815," PREDETERIMNED" should read --
PREDETERMINED -- and in step "822," "PREDETERIMNED" should read --
PREDETERMINED --.

Column 1,
Line 22, "material" should read -- material. --
Line 42, "wavelengths" should read -- wavelengths. --

Column 2,
Line 34, "state" should read -- stage --.

Column 4,
Line 10, "improved" should read -- improved. --.
Line 44, "port" should read -- port. --

Column 5,
Line 23, "from" should read -- form --.

Column 7,
Line 2, the second occurrence of "or" should br deleted

Column 9,
Line 39, "the a" should read -- a --.

Column 10,
Line 25, "Plural" should read -- plural --.
Line 43, "need of" should read -- need for --.

Column 11,
Line 1, "water," should read -- wafer, --.
Line 38, "so one," should read -- so on, --.

Column 12,
Line 65, "vendor" should read -- vendor. --

Column 13,
Line 19, "communicated" should read -- communicated. --.
Line 66, "an user" should read -- a user --.

UNITED STATES PATENT AND TRADEMARK OFFICE
CERTIFICATE OF CORRECTION

PATENT NO.      : 6,734,950 B2
DATED           : May 11, 2004
INVENTOR(S)     : Hitoshi Nakano It is certified that error appears in the above-identified patent and that said Letters Patent is hereby corrected as shown below:

Column 14,
Line 13, "items," should read -- item, --.

Column 15,
Line 10, "enabled" should read -- enabled. --.

Signed and Sealed this

Twenty-fourth Day of August, 2004

JON W. DUDAS
*Director of the United States Patent and Trademark Office*